US005600243A

United States Patent [19]
Colclough

[11] Patent Number: 5,600,243
[45] Date of Patent: Feb. 4, 1997

[54] MAGNETICALLY SHIELDED MAGNETIC SENSOR WITH SQUID AND GROUND PLANE

[75] Inventor: Mark S. Colclough, West Midlands, England

[73] Assignee: Conductus, Inc., Sunnyvale, Calif.

[21] Appl. No.: 403,728

[22] PCT Filed: Sep. 7, 1993

[86] PCT No.: PCT/US93/08496

§ 371 Date: Mar. 17, 1995

§ 102(e) Date: Mar. 17, 1995

[87] PCT Pub. No.: WO95/07470

PCT Pub. Date: Mar. 16, 1995

[51] Int. Cl.⁶ .................................................. G01R 33/035
[52] U.S. Cl. .................................................. 324/248; 505/846
[58] Field of Search .......................... 324/248; 505/845, 505/846; 326/5; 327/510; 336/84 C, 84 M

[56] References Cited

U.S. PATENT DOCUMENTS

| | | | |
|---|---|---|---|
| 5,012,190 | 4/1991 | Dössel | 324/248 |
| 5,185,527 | 2/1993 | Bluzer | 324/248 X |
| 5,287,057 | 2/1994 | Gotoh | 324/248 |
| 5,319,307 | 6/1994 | Simmonds | 324/248 |

FOREIGN PATENT DOCUMENTS

| | | | |
|---|---|---|---|
| 0313132 | 4/1989 | European Pat. Off. | G01R 33/035 |
| 0327123 | 9/1989 | European Pat. Off. | G01R 33/035 |
| 567386 | 10/1993 | European Pat. Off. | 324/248 |

Primary Examiner—Gerard R. Strecker
Attorney, Agent, or Firm—Judith A. DeFranco, Esq.

[57] ABSTRACT

A coupling structure for coupling a feedback signal to a superconducting quantum interference device (SQUID) by mutual inductance. In one embodiment the SQUID loop (A) is shielded from external magnetic fields perpendicular to it by a superconducting ground plane (B) at all points except for the pick-up loop (C). A feedback signal is coupled to the SQUID loop (A) by a feedback loop (D) which has a mutual inductance with the SQUID loop (A). During operation, the feedback loop (D) conducts a current in only one direction around the SQUID loop (A). This geometry ensures that the SQUID loop (A) is shielded from external magnetic fields, except at the pick-up loop (C), by the ground plane, and is balanced against fields parallel to the ground plane. The magnetic field produced by the current in the feedback coil (D) is small far from the SQUID (A). The feedback loop (D) is connected to exterior feedback electronics.

9 Claims, 6 Drawing Sheets

MAGNETICALLY SHIELDED MAGNETIC SENSOR WITH SQUID AND GROUND PLANE

FIELD OF THE INVENTION

This invention relates to an improved coupling structure for a superconducting quantum interference device (SQUID) incorporating a flux pick-up loop. More particularly, it relates to a nearly planar arrangement of coupling structure, SQUID, and ground plane which is self-shielding.

BACKGROUND

Superconducting quantum interference devices (SQUIDs) are extremely sensitive detectors of magnetic flux. When paired with appropriate feedback and readout electronics, SQUIDs can detect magnetic fields corresponding to fractions of a flux quantum ($\Phi_0$).

Because of the nature of magnetic fields, SQUIDs can be used in applications where light does not penetrate and sound is distorted. SQUIDs can be used to detect underwater objects such as mines and submarines, or to determine probable locations of oil and mineral deposits. They can detect magnetic signals produced by the body as well, detecting the firing of neurons in the is brain in magnetoencephalography (MEG), or disease in soft tissues in magnetic resonance imaging (MRI).

In certain cases, however, this extreme sensitivity to magnetic fields can be detrimental to a SQUID's performance in an application. For example, a large background field can mask a smaller field that is of interest. In this case the SQUID must be very sensitive to see the small target signal. However, if the large background field penetrates even a small portion of the SQUID's field of view it can swamp the signal.

Typically in such uses of SQUIDs as magnetometers, both the SQUID and the object under study are located within a magnetic shield. This can be a "shielded room" which is available commercially and which is simply a room built to reject any external magnetic or s electromagnetic signals. Another option is to completely enclose the object and sensor in a superconducting enclosure. Since superconductors are perfect diamagnets, no magnetic field can penetrate a superconducting plate or box. (Under certain conditions, magnetic flux can penetrate a superconductor. However, it is easy to predict the magnetic field strength which will be shielded by any superconducting shield, and to design the shield to accomplish this task.) Unfortunately, this shielding is not possible in all situations.

One example of such a situation is the use of SQUIDs for magnetic microscopy and non-destructive testing (NDT), or evaluation (NDE). In these applications, spatial resolution is very important. The change in a magnetic signature over regions a few micrometers in diameter can be important for pathologists looking at a biopsy sample or for aircraft maintenance engineers looking for an incipient crack in a corroded weld. The small field of view and the typically small changes in magnetic field that must be detected require the use of extremely sensitive SQUIDs. At the same time, the small field of view or the fineness of the array precludes the use of external shields to block background magnetic fields from equipment like computers or from the earth itself. The combination of very sensitive detectors and an unshielded environment places stringent requirements on the magnetic sensing system.

DISCUSSION OF THE ART

In order to operate SQUIDs as flux sensors, it is usually necessary to have a means for applying magnetic flux feedback, possibly in addition to a small alternating modulation flux, in order to implement the flux-locked loop. This requires a mutual inductance between a coil (the feedback coil) and the SQUID loop. The mutual inductance is defined as the flux introduced into the loop per unit current in the coil. When the SQUID encounters a magnetic field, the resulting change in flux in the SQUID loop causes the electrical output of the SQUID to change. The feedback electronics counteracts this change by introducing into the feedback coil a current which produces in the SQUID loop a flux equal and opposite to that produced by the applied magnetic field. By monitoring the current required to stabilize the flux in the SQUID, the readout electronics measures the magnitude of the magnetic field encountered.

The thin-film structures that are generally used for the SQUID and feedback coils have a disadvantage in applications like a magnetic microscope, where it is desirable to prevent the SQUID loop from coupling to an external magnetic field except at a specially defined location. The usual structures expose some of the area of the SQUID loop to external fields, which makes the microscope sensitive to field at places other than where sensitivity is desired.

FIG. 1 shows an example of a prior art integrated SQUID/ feedback coil structure used for magnetic microscopy. The feedback coil is very close to the SQUID loop for maximum coupling and reduced area. Unfortunately, the geometry of this coupling scheme makes the sensor extremely vulnerable to external magnetic fields.

SUMMARY OF THE INVENTION

The present invention provides a solution to this dilemma. A new SQUID design is proposed wherein the feedback coil and SQUID loop are essentially planar and shielded from external magnetic fields by a superconducting ground plane.

In this design, the SQUID loop is a ground-planed stripline or microstripline structure which is shielded from external fields applied perpendicular to the thin film, and which is balanced against external fields in the plane of the film.

More features and advantages of the proposed structure can be understood with reference to the drawing figures and the more detailed description of the preferred embodiments. Because of the relative size of the various features important to the SQUID sensor's operation, FIGS. 1, 2, and 3 are not to scale.

BRIEF DESCRIPTION OF THE DRAWINGS

FIG. 3a shows a cross-section taken through the SQUID loop, while

FIG. 5a shows the I–V characteristic of the prior art SQUID sensor of FIG. 1. FIG. 5b shows the I–V characteristic of the improved SQUID sensor of FIG. 2.

FIG. 6a shows the V–Φ characteristic of the prior art SQUID sensor of FIG. 1. FIG. 6b shows the V–Φ characteristic of the improved SQUID sensor of FIG. 2.

DESCRIPTION OF THE PREFERRED EMBODIMENTS

Figure 1:
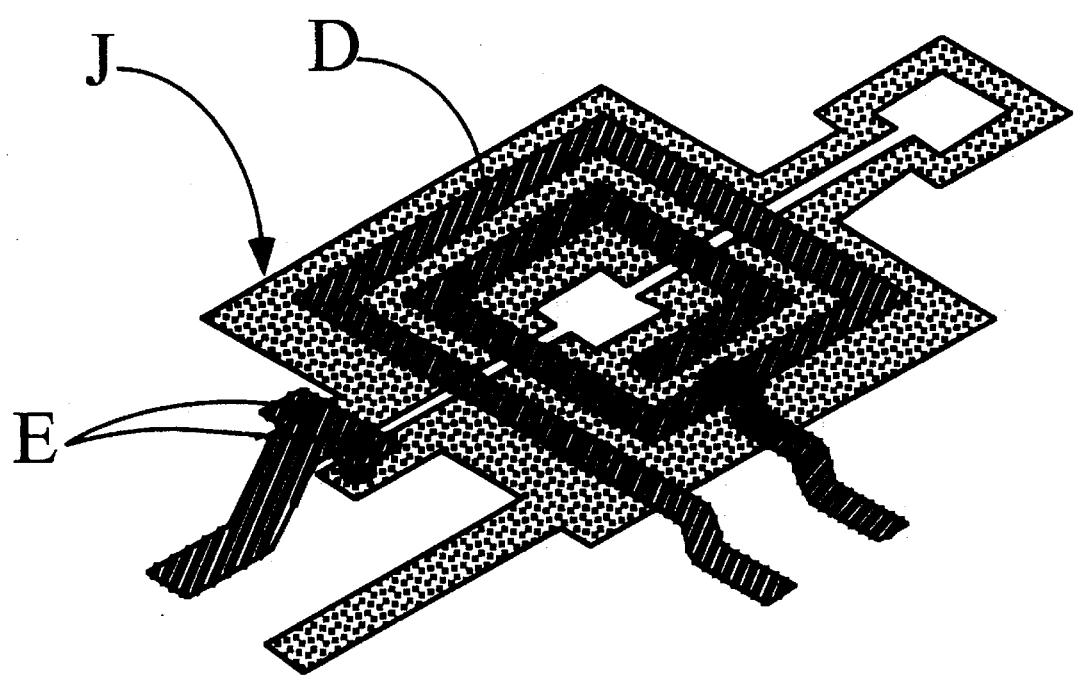
FIG. 1 shows a perspective view of a prior art SQUID sensor.

A SQUID detects magnetic fields by counting the number of flux quanta that are applied to the SQUID loop. In all conductors, magnetic fields and currents are related. A current flowing in a diamagnetic conductor produces a magnetic field, and a magnetic field induces a current in a nearby diamagnetic conductor. The induced current flows in a direction which produces a magnetic field opposed to the original magnetic field, so that the resulting magnetic field is lowered. For most materials at most temperatures the response of the material is imperfect, that is, the induced current decays and the resulting magnetic field regains its full value a short time after the initial current is applied. Superconductors, however, are perfect diamagnets, so a perfect ring of superconductor will not allow the magnetic flux inside the ring to change at all. This is a thermodynamic property of superconductors. When exposed to a magnetic field, a supercurrent is induced in the ring, and the supercurrent exactly counters the magnetic field to which it is exposed. Thus, in principle, measuring the current flowing in the superconducting ring gives the magnetic field strength near the superconductor.

Superconductors have limits, as do all physical things. Superconductors only superconduct below a critical, or transition, temperature $T_c$. They also "go normal" or lose their superconducting properties when the current flowing through them exceeds a critical current, $I_c$; this is often expressed at the critical current density ($J_c$) of the material. Finally, superconductors can repel only so much magnetic flux before undergoing the transition back to normal materials. The maximum magnetic field a superconductor can take before this transition is called the critical field, $H_c$. These three properties of a superconductor are related. At temperatures close to $T_c$ or in a high magnetic field a superconductor can carry less current than its theoretical maximum, and so forth.

Commercial SQUIDs take advantage of these limits. They incorporate one or two weak-link junctions (labeled "E" in FIGS. 1 and 2) into the SQUID loop (A). These junctions (E) may be any kind of weak link, and their nature and number will depend on the particular circuit design. If fabricated using niobium technology, they would be tunneling Josephson junctions or superconductor-normal-superconductor (SNS) junctions. The Nb tunnel junctions also require a pair of shunt resistors. For high-temperature superconductive (HTS) applications, the junctions may be SNS, step-edge, grain boundary, or thinned weak links. Such junctions are referred to as "weak links" because they are the locations most likely to go normal. Similarly, the SQUIDs may be fabricated from any superconductor, as long as the operating temperature of the sensor is kept below the superconducting transition temperature of the material chosen. Appropriate materials include both conventional superconductors and high-temperature superconductors. Conventional superconductors are usually metallic and have superconducting transition temperatures below about 23K. They include all of the elemental superconductors, the Chevrel phases, NbN, $Nb_3Ge$, $Nb_3Sn$, and other A15 compounds. High-temperature superconductors have superconducting transition temperatures above about 23K and as high as about 133K. They are also known as oxide superconductors, cuprate superconductors, and perovskite superconductors because of their compositions and crystal structures. These include any of the superconducting phases of LaCuO, LaBaCuO, LaSrCuO, TlBaCaCuO, BiSrCaCuO, TlPbSrCaCuO, HgBaCaCuO and $ErBa_2Cu_3O_7$-δ, in addition to $YBa_2Cu_3O_7$-δ.

When exposed to a magnetic field, the current in the SQUID loop increases and decreases periodically as the field increases, with a period of one flux quantum. When this happens, there is a periodic rise and fall in the voltage that develops across the SQUID in response to the constant bias current applied by the control electronics. By measuring the size of the current that has to be applied to the feedback coil in order to keep the voltage developed across the SQUID constant, or alternatively by counting the oscillations of the voltage, the magnetic field strength can be calculated.

In order to accurately transform the applied feedback current to a measured magnetic field the coupling between the feedback coil (D) and the SQUID loop (A) must be well defined. The feedback coil (D) is normally coupled inductively to the SQUID loop (A). As seen in FIG. 1, this is often accomplished by using a multi-turn coil over a secondary hole in the SQUID.

Referring to FIG. 1, a magnetic sensor for non-destructive testing/evaluation (NDT/NDE) or microscopy consists of a SQUID (J) and a feedback coil (D). The SQUID (J) has a SQUID loop (A), part of which is called a pick-up loop (C), and one or two weak-link or Josephson junctions (E). In order to obtain strong coupling between the feedback coil and the SQUID loop, they must be close together. In this configuration the pan of the SQUID loop (A) coupled to the feedback coil (D) can act as a secondary pick-up loop, coupling external magnetic fields into the SQUID.

This secondary coupling causes two problems. The first is a loss of resolution. The position of the origin of a magnetic signal is determined by the position of the SQUID pick-up loop (C). A magnetic signal coupled to the SQUID (J) by the feedback structure may have a different origin, in which case the mapping of magnetic signal to physical location will be distorted. A second problem is a reduction in signal to noise ratio (SNR). Because the desired signal comes from a small area to increase spatial resolution, the SQUID must be very sensitive. If the feedback structure is much larger than the pick-up loop it may couple more strongly to an extraneous background signal, such as the earth's magnetic field. This spurious signal may be of the same order as the desired signal, or may be even stronger. In this case, the SQUID may be overloaded by the spurious signal.

Figure 2:
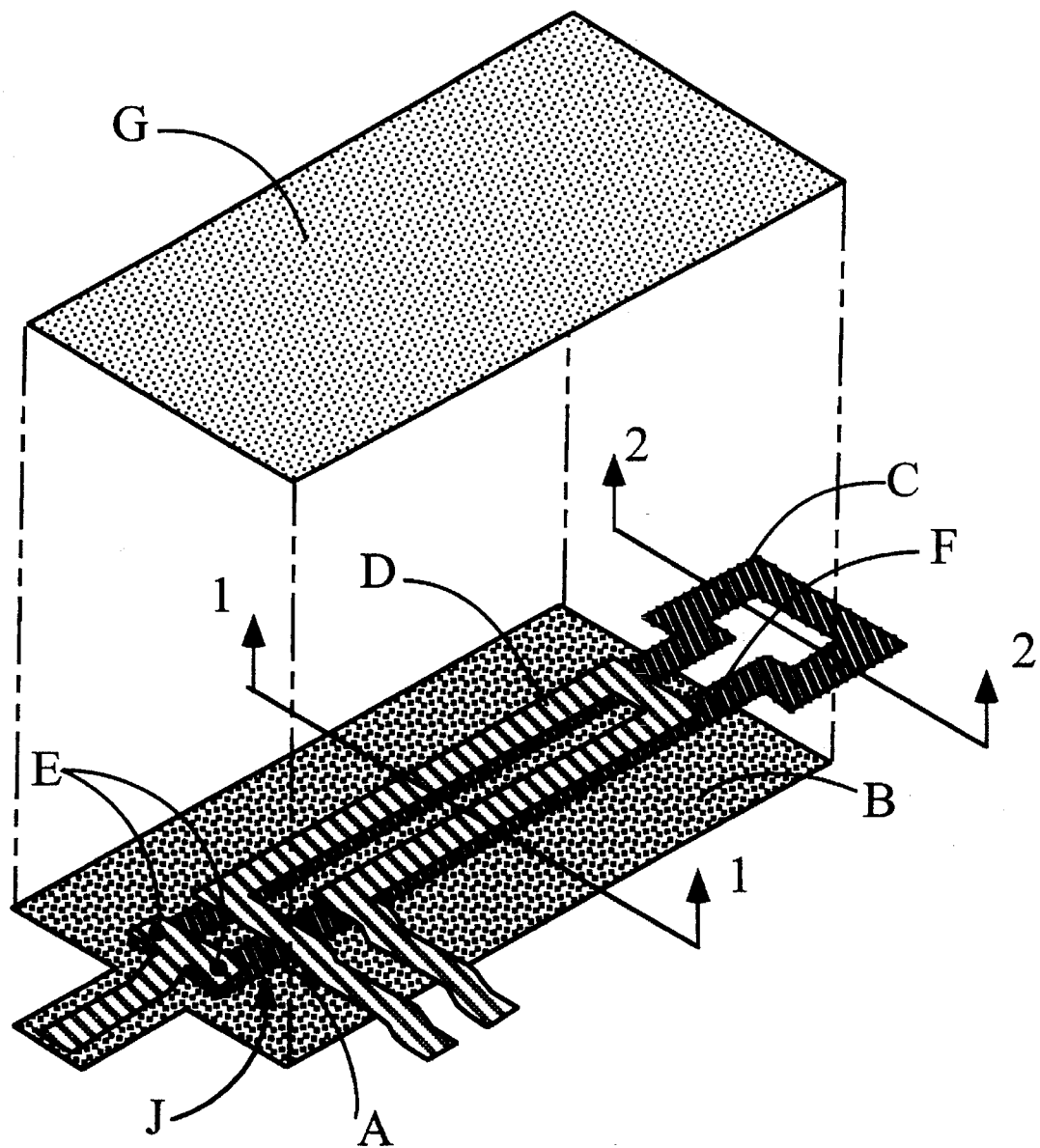
FIG. 2 shows a perspective view of the improved SQUID sensor of the invention.
Figure 3A:
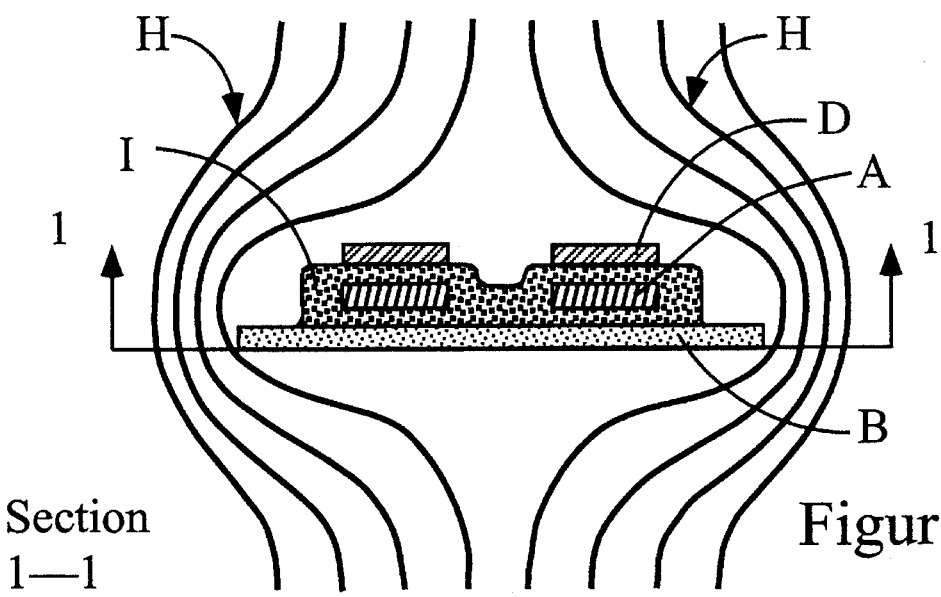
Figure 3B:
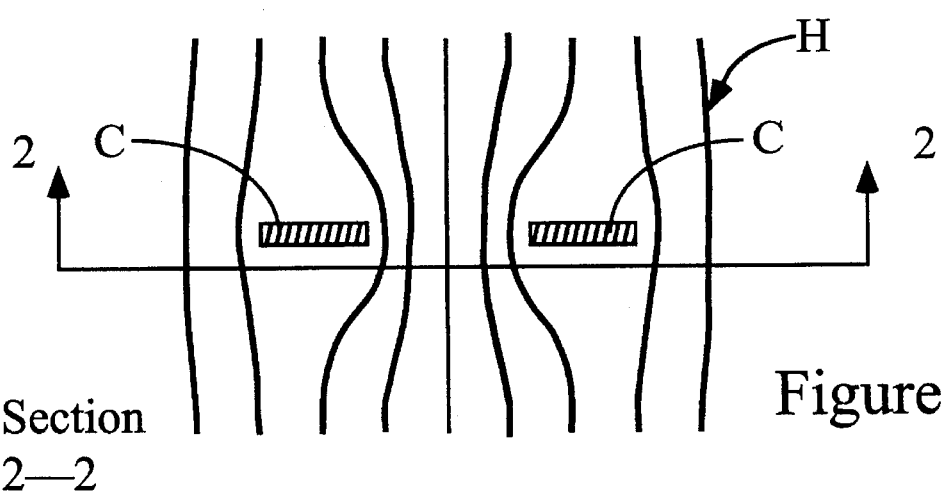
FIG. 3b shows a cross-section taken through the pick-up loop.

The improved SQUID coupling structure of the instant invention is shown schematically in FIG. 2. Here, in addition to the SQUID loop (A) with pick-up loop (C) and coupling loop (D) to feedback electronics (not shown), there is a superconducting Found plane (B). Because a superconductor is a perfect diamagnet, magnetic fields cannot penetrate a superconducting ground plane. This is illustrated schematically in the cross-sections of FIGS. 3a and 3b. FIG. 3a is a cross-section taken through the body of the SQUID along line 1—1 of FIG. 2. The ground plane (B) excludes the magnetic fields (H) from the SQUID loop (A) and the feedback loop (D). This view also shows the dielectric insulation (I) that may be present in an actual structure. FIG. 3b shows a cross-section taken along line 2—2 of FIG. 2, through the pick-up loop (C). Here there is no shielding, and the magnetic field (H) penetrates the opening in the pick-up loop (C) where it is detected by the SQUID. Thus magnetic fields (H) perpendicular to the ground plane and to the plane of the SQUID can penetrate only in the area of the pick-up loop. This limits the field of view to the desired area of the plane. Further, because the SQUID loop is entirely planar, magnetic fields in the plane of the ground plane do not introduce any flux into the SQUID. Electrical connections are made to the SQUID loop at the counterelectrode of junctions (E) and via its connection to the ground plane (F).

A further advantage of the improved coupling structure is that the sample being measured is less disturbed by the magnetic field produced by the feedback loop (D) than it is by the field of feedback coils of conventional SQUIDs. This advantage results from the bifilar geometry of the feedback coil and from the proximity of the ground plane, which give rise to a smaller leakage of field than does the conventional spiral coil.

Since the improved sensor is shielded by the superconducting ground plane from external magnetic fields perpendicular to its plane there are no components of magnetic field that can couple to the SQUID except in the region of the pick-up loop, that is, the region of interest.

If desired, a second ground plane (G), shown lifted off the structure in FIG. 2, can be added to improve the shielding of the SQUID loop (A) and the feedback coil (D). The resulting structure is an example of a stripline, rather than a microstripline, configuration. Another optional addition to the basic scheme is a bias connection (F) between the ground plane (B) in FIG. 2, and the SQUID loop (A). These additional features may enhance the performance of the magnetic sensor, but are not necessary for the successful operation of the improved coupling scheme.

Figure 4:
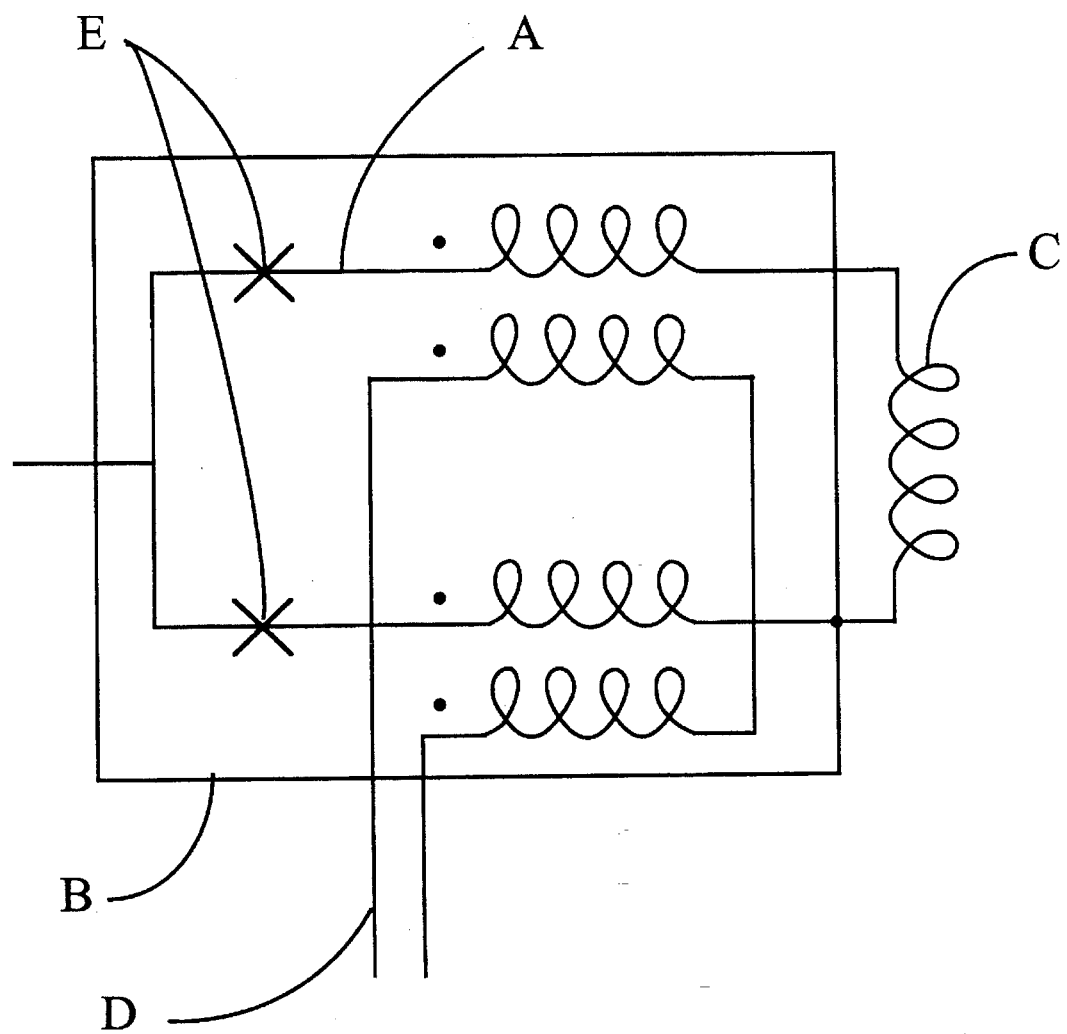
FIG. 4 shows an equivalent circuit of the SQUID sensor.

FIG. 4 shows an equivalent circuit of the improved SQUID sensor. The pick-up loop (C) lies partially outside the region shielded by the ground plane (B) and is exposed to a magnetic flux. The SQUID junctions (E) are shielded from all other fields. A feedback loop (D) is inductively coupled to the SQUID loop (A) to allow for flux-locked loop operation. During operation, a field is applied to the SQUID using the feedback coil to counteract the effect of the detected magnetic flux. The feedback electronics monitors the amount of current applied and converts the current to a magnetic field measurement.

FIGS. 5a, 5b, 6a and 6b show performance data of the prior art and improved SQUID sensors. An ideal SQUID has an I–V characteristic (compare FIGS. 5a and 5b) that is vertical at zero voltage, bends smoothly at the critical current $I_c$, and then has a linear I–V relationship (constant resistance). The V–Φ characteristic of an ideal SQUID (compare FIGS. 6a and 6b) is smooth and approximately sinusoidal, with each period of the sinusoid corresponding to the application of a single flux quantum to the SQUID.

Figure 5A:
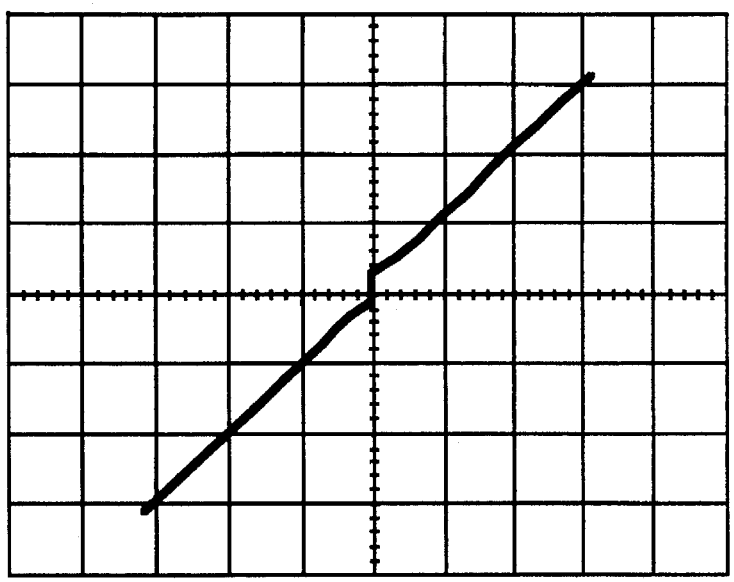
FIGS. 5a and 5b show a comparison of the current-voltage (I–V) characteristics of the prior art and improved SQUID sensors.
Figure 5B:
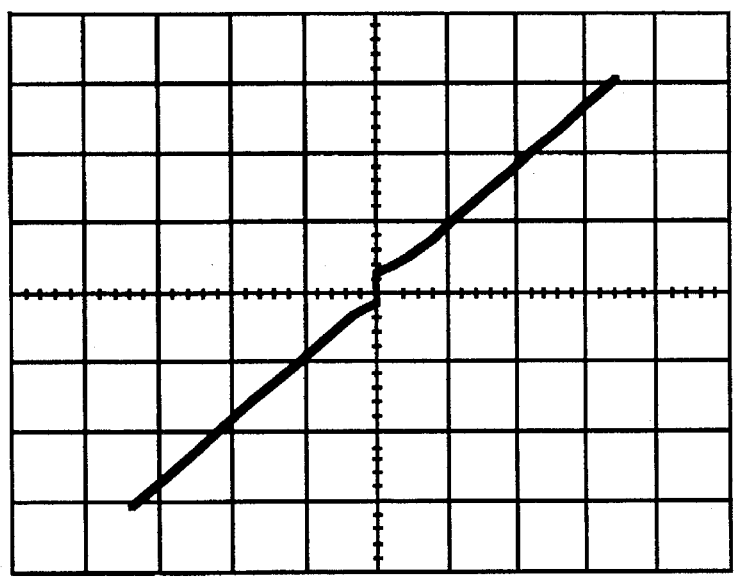

The I–V characteristic of the prior art SQUID sensor of FIG. 1, seen in FIG. 5a shows substantial deviations from ideality. Its complex structure induces radio frequency resonances that show up as steps in the nominally linear portion of the I–V curve. In contrast, the I–V characteristic of the improved SQUID sensor of FIG. 2 (FIG. 5b) is much more ideal.

Figure 6A:
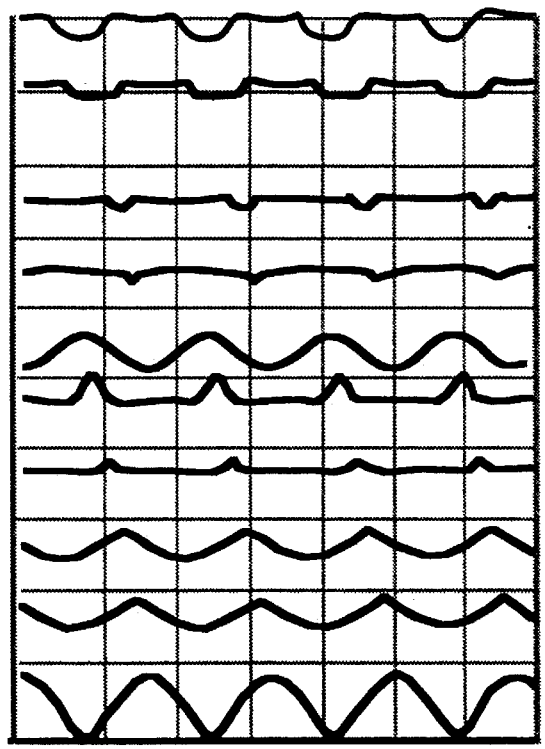
FIGS. 6a and 6b show a comparison of the voltage-flux (V–Φ) characteristics of the prior art and improved SQUID sensors.
Figure 6B:
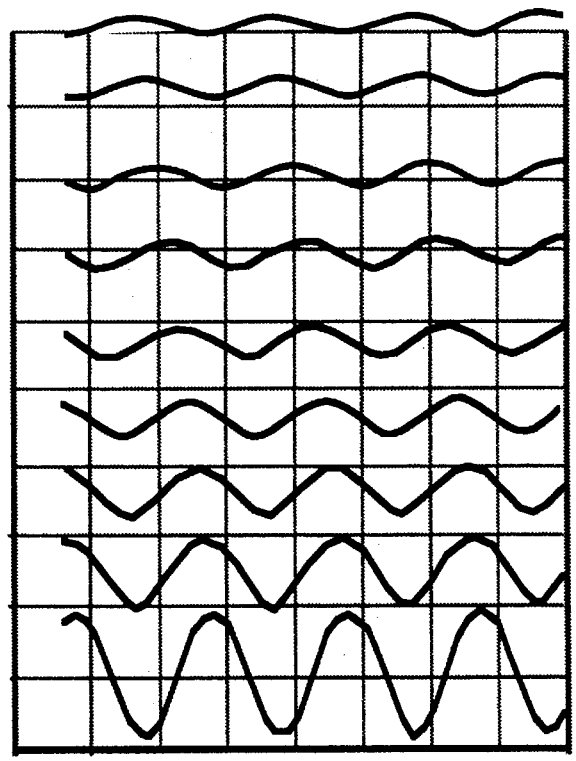

FIG. 6a shows the V–Φ characteristic of the prior art SQUID sensor of FIG. 1. Here the deviations from sinusoidal behavior are quite remarkable. FIG. 6b shows the V–Φ characteristic of the improved SQUID sensor of FIG. 2. The characteristic is substantially sinusoidal over a wide range of SQUID bias currents.

Conclusion

Thus the reader can see that the improved coupling scheme for SQUID sensors allows coupling of the feedback loop to the SQUID loop by mutual inductance while restricting the coupling of the SQUID to external magnetic fields and confining the effect of the feedback loop to the SQUID.

While the above description contains many specific details, these should not be construed as limitations on the scope of the invention, but rather as an exemplification of one preferred embodiment of it. Many other variations are possible. For example, a single junction rf SQUID might be preferred in some applications. In other applications it might be desirable to add damping resistors in parallel with the feedback loop, SQUID loop or Josephson junctions, or between the ground plane and the other layers. Other variations will no doubt occur to those skilled in the art of superconductive electronics.

Additional advantages and modifications will no doubt be found by those using the above-described SQUID coupling topology. Therefore, the scope of the invention should be determined not by the embodiment illustrated, but by the appended claims and their legal equivalents.

What is claimed is:

1. A magnetic sensor comprising:
   a superconducting ground plane;
   a SQUID comprising a pickup loop, a SQUID loop and at least one weak-link junction, said SQUID loop and said pickup loop lying in a single plane, said SQUID loop being displaced from said superconducting ground plane in a direction normal to the plane and substantially overlying said superconducting ground plane and said pick-up loop lying exterior to the area overlying said superconducting groundplane; and
   a feedback loop, said feedback loop being displaced from said superconducting ground plane and from said SQUID in a direction normal to the plane, said feedback loop substantially overlying said SQUID loop, and said feedback loop having a bifilar geometry and a mutual inductance with said SQUID loop wherein said feedback loop conducts a current in a direction around the feedback loop, said current producing a magnetic field at each point along said feedback loop, and the sum of said magnetic fields being approximately equal at a distance from said feedback loop.

2. The magnetic sensor of claim 1 wherein said feedback loop is intermediate said SQUID and said superconducting ground plane.

3. The magnetic sensor of claim 1 wherein said SQUID is intermediate said feedback loop and said superconducting ground plane.

4. The magnetic sensor of claim 1 further comprising a second superconducting ground plane, said second superconducting ground plane being displaced from said SQUID, said feedback loop, and said superconducting ground plane in a direction normal to the plane, and said SQUID and said feedback loop lying between the two superconducting ground planes.

5. The magnetic sensor of claim 1 further comprising an electrical connection between said SQUID and said superconducting ground plane.

6. The magnetic sensor of claim 2 further comprising a second superconducting ground plane, said second superconducting ground plane being displaced from said SQUID, said feedback loop, and said superconducting ground plane in a direction normal to the plane, and said SQUID and said feedback loop lying between the two superconducting ground planes.

7. The magnetic sensor of claim 3 further comprising a second superconducting ground plane, said second superconducting ground plane being displaced from said SQUID, said feedback loop, and said superconducting ground plane in a direction normal to the plane, and said SQUID and said feedback loop lying between the two superconducting ground planes.

8. The magnetic sensor of claim 2 further comprising an electrical connection between said SQUID and said superconducting ground plane.

9. The magnetic sensor of claim 3 further comprising an electrical connection between said SQUID and said superconducting ground plane.

* * * * *